United States Patent [19]
Ushifusa et al.

[11] Patent Number: 4,736,276
[45] Date of Patent: Apr. 5, 1988

[54] MULTILAYERED CERAMIC WIRING CIRCUIT BOARD AND THE METHOD OF PRODUCING THE SAME

[75] Inventors: Nobuyuki Ushifusa; Satoru Ogihara, both of Hitachi; Kousei Nagayama, Ibaraki; Hiroichi Shinohara, Hitachi; Gyozo Toda, Hino, all of Japan

[73] Assignee: Hitachi, Ltd., Tokyo, Japan

[21] Appl. No.: 865,396

[22] Filed: May 21, 1986

[30] Foreign Application Priority Data

May 21, 1985 [JP] Japan ................................. 60-109112

[51] Int. Cl.$^4$ ........................... H05K 1/11; B32B 9/04
[52] U.S. Cl. ..................................... 361/414; 29/851; 174/68.5; 264/61; 428/137; 428/209; 428/446; 428/702; 428/901; 501/128
[58] Field of Search .............................. 361/397–398, 361/411, 414; 174/68.5; 501/5, 6, 127, 128, 153–154, 32; 428/137, 446, 702, 901, 209; 264/59, 61; 29/848, 851–852

[56] References Cited

U.S. PATENT DOCUMENTS

| 4,272,500 | 6/1981 | Eggerding et al. | 501/5 |
| 4,396,720 | 8/1983 | Beall et al. | 501/5 |
| 4,460,916 | 7/1984 | Hashimoto et al. | 428/446 X |
| 4,528,275 | 7/1985 | Hodge | 501/128 |
| 4,620,264 | 10/1986 | Ushifusa et al. | 361/414 |

FOREIGN PATENT DOCUMENTS

| 0131242 | 1/1985 | European Pat. Off. | 361/414 |
| 678636 | 9/1952 | United Kingdom | 501/128 |
| 736148 | 9/1955 | United Kingdom | 501/128 |

Primary Examiner—A. T. Grimley
Assistant Examiner—Jane K. Lau
Attorney, Agent, or Firm—Antonelli, Terry & Wands

[57] ABSTRACT

Ceramic insulating substrate layers (1) for a multilayered ceramic wiring circuit board (3) consist essentially of crystals of mullite and sillimanite, non-crystalline silicon dioxide occupying the interstices between the crystals and magnesium oxide dissolved substantially in the crystals in solid solution and have a thermal expansion coefficient of $40-60\times10^{-7}/°$ C. and a dielectric constant below 6.7.

21 Claims, 4 Drawing Sheets

MULTILAYERED CERAMIC WIRING CIRCUIT BOARD AND THE METHOD OF PRODUCING THE SAME

FIELD OF THE INVENTION

The present invention relates to a multilayered ceramic wiring circuit board with a high density interconnection therein and suitable for direct mounting of semiconductor components of silicon and gallium arsenide so as to constitute a functional module and more particularly to a ceramic insulating substrate layer for the multilayered ceramic wiring circuit board and the method of producing the same.

BACKGROUND OF THE INVENTION

A mulitilayered ceramic wiring circuit board includes a plurality of ceramic insulating substrate layers laminated integrally, conductor layers with predetermined patterns supported on the respective ceramic insulating substrate layers and via hole conductors provided at predetermined positions of the respective ceramic insulating substrate layers for interconnecting the respective predetermined patterned conductor layers to form a predetermined wiring circuit.

Simultaneous firing of the ceramic insulating substrate layers, the conductor layers, and the via hole conductors for completing the multilayered ceramic wiring circuit board, particularly one with a high density interconnection therein, often causes cracking in the ceramic insulating substrate layers due to the difference in thermal expansion coefficients between the ceramic insulating substrate layers and the conductor layers and the via hole conductors. Especially when alumina with a firing temperature 1500°-1650° C. is used as the ceramic insulating substrate layers and tungsten or molybdenum as the conductor layers and via hole conductors, whose firing temperature agrees with that of alumina, thus being applicable to the simultaneous firing, cracking is caused in the ceramic insulating substrate layers during the simultaneous firing by thermal stress due to the difference in thermal expansion coefficients, since the thermal expansion coefficients of alumina, tungsten and molybdenum are $75\times10^{-7}/°C.$, $45\times10^{-7}/°C.$ and $54\times10^{-7}/°C.$ respectively (at room temperature to 500° C.).

Further, with the increasing tendency of speed-up and high density of integrated circuits such as LSI made of silicon, a method of mounting the silicon LSI directly on the multilayered ceramic wiring circuit board has recently come into use for purpose of heat dissipation and speed-up of semiconductor devices. This mounting method, however, gives rise to problems in that with the increase in size of the silicon LSI, the thermal stress at the junctures between the silicon LSI and the multilayered ceramic wiring circuit board, caused by a temperature change during the mounting of the silicon LSI on the multilayered ceramic wiring circuit board, increases. Alumina is generally used for the conventional multilayered ceramic wiring circuit board as explained above, and the thermal expansion coefficient of which is $75\times10^{-7}/°C.$ (at room temperature to 500° C.), is more than two times that of silicon i.e. $35\times10^{-7}/°C.$ (at room temperature to 500° C.). The thermal stress at the junctures between the silicon LSI and the alumina multilayered wiring circuit board caused by a temperature change during the direct mounting becomes large, which leads to degradation of reliability of the junctures.

Further the alumina multilayered wiring circuit board lowers the electrical signal propagation speed, because the dielectric constant of alumina is as large as 9.5 (at 1 MHZ).

U.S. Pat. No. 4,460,916 discloses ceramic insulating substrate layers for the multilayered ceramic wiring circuit board, essentially consisting of crystals of mullite and crystals of cordierite occupying the interstices between the crystals of mullite. Since the thermal expansion coefficient of mullite and cordierite are $42-45\times10^{-7}/°C.$ and $10-20\times10^{-7}/°C.$ respectively, the thermal expansion coefficient of the resultant ceramic insulating substrate layers is $38-39\times10^{-7}/°C.$ which is close to that of silicon i.e. $35\times10^{-7}/°C.$, so that the breaking of wires at the junctures between the silicon LSI and the multilayered ceramic wiring circuit board is prevented. However the temperature for the simultaneous firing of the ceramic insulating substrate layers and the conductor layers and the via hole conductors made of tungsten or molybdenum has to be controlled in the vicinity of 1500° C., because the cordierite phase disappears above that temperature. However, the conductor layers and the via hole conductors are insufficiently fired at the temperature of 1500° C. In addition, since the thermal expansion coefficients of tungsten and molybdenum are $45\times10^{-7}/°C.$ and $54\times10^{-7}/°C.$, respectively and the difference in thermal expansion coefficient between the ceramic insulating substrate layers and the conductive layers and the via hole conductors made of tungsten or molybdenum is large, cracking is generated during the simultaneous firing thereof as in the case of using alumina for the ceramic insulating substrate layers as mentioned above.

Furthermore, semiconductor components made of gallium arsenide have been widely used recently. The thermal expansion coefficient of the gallium arsenide semiconductor components is $65\times10^{-7}/°C.$ Therefore, the thermal expansion coefficient of the multilayered ceramic wiring circuit board is preferably between that of silicon i.e. $35\times10^{-7}/°C.$ and that of gallium arsenide i.e. $65\times10^{-7}/°C.$

SUMMARY OF THE INVENTION

One object of the present invention is to provide ceramic insulating substrate layers for a multilayered ceramic wiring circuit board having a thermal expansion coefficient close to both tungsten and molybdenum such that the simultaneous firing of the ceramic insulating substrate layers and the conductor layers and the via hole conductors made of tungsten or molybdenum can be done cracking of the ceramic insulating substrate layers caused by thermal stress due to the thermal expansion coefficient difference.

Another object of the present invention is to provide ceramic insulating substrate layers for a multilayered ceramic wiring circuit board having a thermal expansion coefficient between that of silicon and gallium arsenide such that the direct mounting of the semiconductor components made of silicon and/or gallium arsenide on the multilayered ceramic wiring circuit board can be done without breaking of wires at the solder juncture caused by thermal stress due to the thermal expansion coefficient difference.

A further object of the present invention is to provide ceramic insulating substrate layers for a multilayered ceramic wiring circuit board having a dielectric constant below 6.7 and a high mechanical strength.

A still further object of the present invention is to provide a method of producing ceramic insulating substrate layers for a multilayered ceramic wiring circuit board having a thermal expansion coefficient of $35-65 \times 10^{-7}/°C.$, more preferably $40-60 \times 10^{-7}/°C.$, a dielectric constant below 6.7 and a high mechanical strength.

The ceramic insulating substrate layers for the multilayered ceramic wiring circuit board of the present invention consist essentially of crystals of mullite ($3Al_2O_3.2SiO_2$), the molar ratio of aluminum oxide and silicon dioxide being 3-4:2, so that stoichiometrically the mullite is aluminum oxide rich; and crystals of an oxide complex of aluminum oxide and silicon dioxide in molar ratio of 1:0.7-1, so that stoichiometrically the complex is silicon dioxide lean, such as sillimanite ($Al_2O_3.SiO_2$), andalusite ($Al_2O_3.SiO_2$) and kyanite ($Al_2O_3.SiO_2$); non-crystalline silicon dioxide occupying interstices between the crystals of mullite and the oxide complex; and at least one component selected from the group consisting of alkali metal oxide and alkaline earth metal oxide dissolved substantially in the crystals in solid solution.

The method of producing ceramic insulating substrate layers for a multilayered ceramic wiring circuit board of the present invention comprises steps of mixing more than 70 wt%, preferably 70-80wt%, more preferably 72wt%, of mullite powder having an average particle size below 5 μm; 10-30wt%, preferably 15-30wt%, more preferably 25-27wt%, of silicon dioxide powder having an average particle size below 2 μm; less than 15wt%, preferably 1-5wt%, more preferably 1.0-2.0wt% of aluminum oxide powder having an average particle size below 1 μm; and less than 1wt%, preferably 0.4-0.8wt% of metal oxide powder of at least one component selected from the group consisting of alkali metal oxide and alkaline earth metal oxide; pressing and forming the mixture; and firing the pressed and formed mixture at a temperature above where the firing shrinkage ratio thereof becomes constant, preferably 1550°-1680° C., more preferably 1580°-1620° C., simultaneously with the conductor layers and the via hole conductors. The ceramic insulating substrate layers thus produced consist essentially of crystals of mullite, sillimanite, andalusite and kyanite, with non-crystalline silicon dioxide occupying the interstices between the crystals and at least one component selected from the group consisting of alkali metal oxide and alkaline earth metal oxide dissolved substantially in the crystals in solid solution; and has a themal expansion coefficient of $40-60 \times 10^{-7}/°C.$, a dielectric constant below 6.7 and a high mechanical strength.

The thermal expansion coefficients of mullite and sillimanite are $42-45 \times 10^{-7}/°C.$ and $35-75 \times 10^{-7}/°C.$ respectively. The thermal expansion coefficients of andalusite and kyanite are the same as that of sillimanite. By including a proper amount of sillimanite, andalusite and/or kyanite in the ceramic insulating substrate layers together with mullite, as the main component, the thermal expansion coefficient of $40-60 \times 10^{-7}/°C.$ of the ceramic insulating substrate layers according to the present invention is obtained.

Further since the dielectric constant of these crystals are 6 to 7 (at 1 MHZ), the dielectric constant of the resultant ceramic insulating substrate layers is reduced below 6.7. Thus the signal propagation speed of the multilayered ceramic wiring circuit board of the present invention is increased.

The addition of silicon dioxide ($SiO_2$) in the mixture lowers the dielectric constant, suppresses grain growth at the time of sintering the mixture and enhances mechanical strength of the ceramic insulating substrate layers. The content of silicon dioxide is preferably 10 to 30 wt%. A 40wt% of silicon dioxide in the mixture is unpreferable from the point of view of mechanical strength.

Silicon dioxide ($SiO_2$) has the smallest dielectric constant among oxides and an increase the amount to be added in the mixture lowers the dielectric constant of the resultant ceramic insulating substrate layers. Addition of silicon dioxide ($SiO_2$) causes a diffusion reaction with mullite ($3Al_2O_3.2SiO_2$) releasing aluminum oxide ($Al_2O_3$) to the mixture and produces a sillimanite, andalusite and/or kyanite ($Al_2O_3.SiO_2$) crystallline phase. Therefore, the crystalline phase of $3Al_2O_3.2SiO_2$ and $Al_2O_3.SiO_2$ are produced in the resultant ceramic insulating substrate layers. These crystalline phases are very stable, and do not vary at a temperature in the vicinity of 1,600° C., which makes the firing shrinkage ratio of the ceramic insulating substrate layers stable by firing them above a predetermined temperature.

In respect to the amount of silicon dioxide to be added, it was found that when the raw materials, and the mixture, except for the mullite, contain more than 75wt% of silicon dioxide, a better effect is brought about.

Aluminum oxide ($Al_2O_3$) is used as a sintering additive for mullite in the mixture and produces sillimanite, andalusite and kyanite together with mullite and silicon dioxide in the mixture.

Alkali metal oxide and alkaline earth metal oxide improve sintering degree but an increase in amount thereof produces crystalline phases and/or non-crystalline phases of oxide complexes formed by the metal oxides and silicon dioxide and/or aluminum oxide and thereby lowers the mechanical strength of the resultant ceramic insulating substrate layers. Further the dielectric constant of the oxide complexes is large which increases the dielectric constant of the resultant ceramic insulating substrate layers. Therefore it is required that the total amount of alkali metal oxide and alkaline earth metal oxide be less than 1 wt% and does not exceed the solid soluble limitation in mullite, sillimanite, andalusite and kyanite. In other words, it is necessary to form ceramic insulating substrate layers which do not contain the crystalline phase of alkali metal oxide and alkaline earth metal oxide. In ceramic insulating substrate layers which contain more than 1wt% alkali metal oxide and alkaline earth metal oxide, the firing shrinkage ratio varies in the temperature range in which the firing is sufficiently conducted, which makes it impossible to obtain a stable sintered body; i.e. the ceramic insulting substrate layer, because of the unstable crystalline phases in the sintered body, which was confirmed by X-ray diffraction.

Examples of alkali metal oxides are oxides of lithium, sodium, potassium, rubidium and cesium and examples of alkaline earth metal oxide are oxides of berylium, magnesium, calcium, stronthium and barium.

Alkali metal oxide and alkaline earth metal oxide are materials which are very unstable in the atmosphere, and if they are left to stand, they absorb water and the like. For this reason, when these oxides are added, they are added in the form of carbonates or hydroxides.

Carbonates and hydroxides decompose in the process of heating-up, and release carbone oxide and water, respectively. At this time the oxides become active and improve sintering degree.

In manufacturing a multilayered ceramic wiring circuit board, it is necessary first to form green bodies, forming conductor layers on each of them, and simultaneously firing a multiplicity of the laminated green bodies. Known methods are the green sheet method, slip casting method, mold forming method by pressing, injection mold method, etc.

The green sheet method is a method of forming a green sheet by means of a green sheet producing apparatus with doctor blades after adding a solvent and a thermoplastic resin to a raw material powder, and deaerating the stirred slurry.

The slip casting method is a method of forming a green sheet by adding water, a dispersing agent and a thermoplastic resin to a raw material powder, and pouring the stirred slurry into, for example, a gypsum mold.

The mold forming method by pressing is a method of forming a green sheet by adding a solvent and a thermoplastic resin to a raw material powder, mixing and stirring by an attrition mill or the like, sieving and granulating, pouring into a mold and pressing.

The injection mold method is a method of inject molding the raw material powder to which a thermoplastic resin, wax or the like is added.

PREFERRED EMBODIMENTS OF THE INVENTION

Embodiment 1

Figure 1:
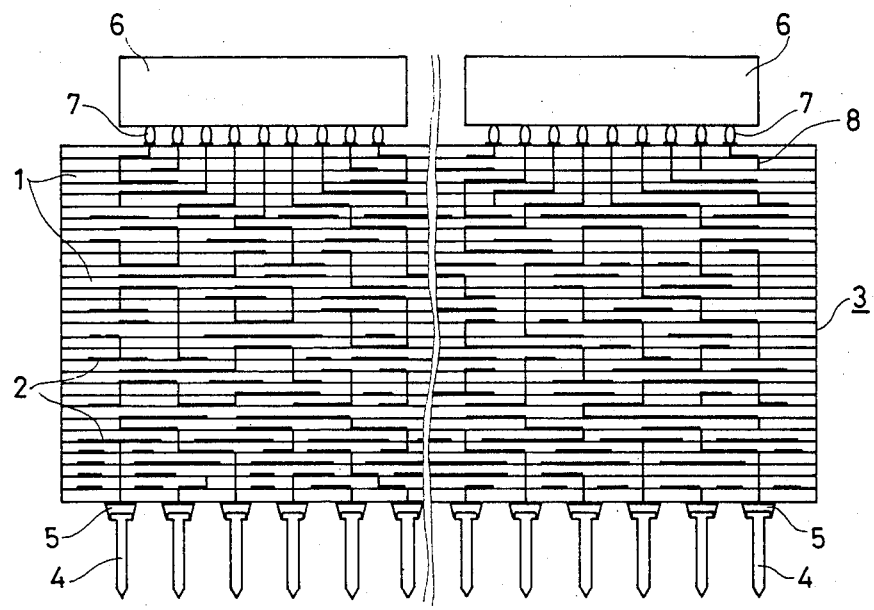
FIG. 1 is a sectional view of a mulilayered ceramic wiring circuit board according to the present invention and a functional module using the board.

An embodiment of a multilayered ceramic wiring circuit board according to the present invention will be described with reference to FIG. 1, which shows the cross section of the embodiment. The reference numeral 1 denotes ceramic insulating substrate layers and horizontal thick lines indicate conductor layers 2 supported on the substrate layers 1. These conductor layers 2 are connected by predetermined via hole conductors 8 which are indicated by vertical thick lines. The reference numeral 4 denotes a Kovar pin connected by a gold-indium solder 5, and 6 denotes semiconductor components which are connected by a solder 7 to multi-layered ceramic wiring circuit board 3.

An embodiment for the method of manufacturing a multilayered ceramic wiring circuit board according to the present invention will now be explained, wherein, "part" means part by weight and "%" means wt%.

72 parts of mullite powder ($3Al_2O_3.2SiO_2$) which is slightly rich in alumina and has an average particle diameter of 2 $\mu$m; 25.3 parts of quartz powder ($SiO_2$) of 1 $\mu$m in average particle diameter; 1.9 parts of alumina powder ($Al_2O_3$) of 0.4 $\mu$m in average particle diameter; 0.8 part (calculated in terms of MgO) of magnesium carbonate ($Mg_5(CO_3)_4(OH)_24(H_2O)$) and 5.9 parts of polyvinyl butyral of 1,000 in average polymerization degree, which is used as a resin, are put into a ball mill and dry blended for 3 hours. To the mixture, 1.9 ml of butylphthalyl butyl glycolate as a plasticizing agent; 46 parts of trichloroethylene; 17 parts of tetrachloroethylene and 18 parts of n-butyl as solvents are added, and the mixture is wet blended for 20 hours to make slurry. Air bubbles were removed from the slurry by vacuum deaeration, and the viscosity was controlled. The slurry was next coated on a polyester film base, which had been subjected to silicon treatment, to a thickness of 0.23 mm by means of a doctor blade, and dried by an oven to form a ceramic green sheet. The ceramic green sheet was removed from the polyester film base which had been subjected to silicon treatment and was cut at an interval of 220 mm. The ceramic green sheet produced in this way was cut into 200 mm × 200 mm by means of a green sheet puncher and provided with holes for guides. Thereafter, the ceramic green sheet was fixed utilizing the guide holes and via holes having a diameter of 0.15 mm were made at predetermined positions by a punching method. A conductor paste consisting of tungsten powder, nitrocellulose, etylcellulose, polyvinyl butyral and trichloroethylene in which ratio of 100:3:1:2:23 was filled in the via holes formed in the ceramic green sheet, and was printed in accordance with a predtermined circuit pattern by a screen printing method. Such green sheets were laid one upon another in the total number of 30 as shown in FIG. 1, with the via holes on each green sheet in alignment with the respective via holes, and pressurized at a temperature of 120° C. and under a pressure of 20 to 30 kg/cm² for lamination. The laminated green sheets were put into a firing oven, and the temperature was elevated to 1,200° C. at the rate of 50° C./h in an atmosphere of nitrogen which contained 3 to 7 vol% hydrogen and a slight amount of water vapor, to remove the resin used at the time of forming the ceramic green sheet. Thereafter the temperature was elevated at the rate of 100° C./h and maintained at the maximum temperature 1,620° C. for one hour. In this state the green sheet was fired with no pressure applied, whereby a multilayered ceramic wiring circuit board such as shown in FIG. 1 was completed. This mullite based multilayered ceramic wiring circuit board thus produced contained about 67 wt% mullite, 9wt% $Al_2O_3.SiO_2$ and about 24wt% $SiO_2$ glass.

The multilayered ceramic wiring circuit board manufactured in this way was subjected to electroless nickel plating and gold plating, and thereafter the Kovar pins 4 were connected to the board with a gold-indium solder 5 by an ordinary method using a carbon jig. The semiconductor component 6 with its face down was connected to and mounted directly on the multilayered ceramic wiring circuit board with the solder 7. In this way, a functional module shown in FIG. 1 was manufactured.

The thermal expansion coefficient of the ceramic insulating substrate layers used for the multilayered ceramic wiring circuit board was $50 \times 10^{-7}/°C$. (at room temperature to 500° C.), which matches with the thermal expansion coefficient $45 \times 10^{-7}/°C$. (at room temperature to 500° C.) of tungsten which was used as the conductor layers and the via hole conductors. Therefore, no stress due to difference in thermal expansion coefficient between the ceramic insulating substrate layers and the conductor layers and the via hole conductors appears and, hence, no cracking was caused. High-density wiring of 0.3 mm in via hole pitch was also enabled. In the ceramic insulating substrate layers after firing, there were mullite ($3Al_2O_3.2SiO_2$) and $Al_2O_3.SiO_2$ crystalline phases. These stable crystalline phases have substantially the same thermal expansion coefficient and therefore no inner stress is caused. It was confirmed by X-ray diffraction and by means of an X-ray microanalyzer that although the added $Mg_5(CO_3)_4(OH)_24H_2O$ was changed into MgO during the elevation of temperature, there existed no oxide complexes of MgO and other components after firing.

The tensile strength of the Kovar pin was more than 4 kg/pin, high enough to be fit for paractical use. No breakage of wire was produced at the solder juncture 7 of the semiconductor component 6 even after more than 2,000 heat cycle tests between −65° C. and 150° C. The strength was so high as to ensure sufficient life time of the juncture under severe use conditions. This is because the thermal expansion coefficient of the sintered body consisting of $3Al_2O_3.2SiO_2$ and $Al_2O_3.SiO_2$ is $50 \times 10^{-7}/°C$., which is approximate both to the thermal expansion coefficient $35 \times 10^{-7}/°C$. (at room temperature to 500° C.) of a silicon semiconductor which is used as a semiconductor component, and to the thermal expansion coefficient $65 \times 10^{-7}/°C$. (at room temperature to 500° C.) of a gallium arsenide semiconductor. Further in a multilayered ceramic wiring circuit board on which a hybrid of a silicon semiconductor and a gallium arsenide semiconductor is mounted, there is little difference in elongation between the board and the semiconductor component when they are heated, and therefore almost no thermal stress is applied to the solder juncture. On the other hand, in a conventional board which contains alumina as the main component, since the thermal expansion coefficient of alumina is $75 \times 10^{-7}/°C$., greatly different from that of a silicon semiconductor device, which are now mainly used as a semiconductor component, thermal stress is applied to the solder juncture when they are heated, leading to breaking of wire.

The signal propagation delay time of the internal wiring conductive material was 8.1 ns/m This value corresponds to the dielectric constant of 6.2 of the ceramic insulating material. In a conventional multilayered wiring circuit board composed of a sintered body which essentially consists of alumina, the dielectric constant of the ceramic insulating material is about 9.5 and the signal propagation delay time is 10.2 ns/m. This means that the signal propagation delay time was reduced by about 20% according to this embodiment.

Embodiment 2

Multilayered ceramic wiring circuit boards were manufactured in the same way as in Embodiment 1 except that the compositions of the ceramic raw material powder were as shown in Table 1 (wt%). The alkali metal oxide and the alkaline earth metal oxide in Table 1 are shown by calculation of carbonates or hydroxides in terms of oxides. The functional module shown in FIG. 1 was manufactured in the same way as in embodiment 1. The additive materials except for mullite were used as a sintering additive.

TABLE 1

| No. | Mullite $3Al_2O_3.2SiO_2$ | Silica $SiO_2$ | Alumina $Al_2O_3$ | Other Additive Metal Oxides | | | |
|---|---|---|---|---|---|---|---|
| | | | | Material | Quantity | Material | Quantity |
| 1 | 70.0 | 15.4 | 10.5 | MgO | 4.1 | | |
| 2 | 70.0 | 22.7 | 5.2 | MgO | 2.1 | | |
| 3 | 70.0 | 24.2 | 4.2 | MgO | 1.6 | | |
| 4 | 70.0 | 25.6 | 3.2 | MgO | 1.2 | | |
| 5 | 70.0 | 27.1 | 2.1 | MgO | 0.8 | | |
| 6 | 70.0 | 28.5 | 1.0 | MgO | 0.5 | | |
| 7 | 70.0 | 30.0 | | | | | |
| 8 | 72.0 | 23.9 | 2.9 | MgO | 1.2 | | |
| 9 | 72.0 | 25.3 | 1.9 | MgO | 0.8 | | |
| 10 | 72.0 | 26.6 | 1.0 | MgO | 0.4 | | |
| 11 | 72.0 | 28.0 | | | | | |
| 12 | 75.0 | 20.1 | 3.5 | MgO | 1.4 | | |
| 13 | 75.0 | 21.3 | 2.6 | MgO | 1.1 | | |
| 14 | 75.0 | 22.6 | 1.7 | MgO | 0.7 | | |
| 15 | 75.0 | 23.8 | 0.9 | MgO | 0.3 | | |
| 16 | 75.0 | 25.0 | | | | | |
| 17 | 78.0 | 17.7 | 3.1 | MgO | 1.2 | | |
| 18 | 78.0 | 18.8 | 1.5 | MgO | 0.9 | | |
| 19 | 78.0 | 19.9 | 1.5 | MgO | 0.6 | | |
| 20 | 78.0 | 20.9 | 0.8 | MgO | 0.3 | | |
| 21 | 78.0 | 22.0 | | | | | |
| 22 | 80.0 | 10.3 | 7.0 | MgO | 2.7 | | |
| 23 | 80.0 | 15.1 | 3.5 | MgO | 1.4 | | |
| 24 | 80.0 | 16.1 | 2.8 | MgO | 1.1 | | |
| 25 | 80.0 | 17.1 | 2.1 | MgO | 0.8 | | |
| 26 | 80.0 | 18.2 | 1.4 | MgO | 0.4 | | |
| 27 | 80.0 | 19.0 | 0.7 | MgO | 0.3 | | |
| 28 | 80.0 | 20.0 | | | | | |
| 29 | 70.0 | 15.4 | 10.5 | MgO | 2.1 | CaO | 2.0 |
| 30 | 70.0 | 22.7 | 5.2 | MgO | 2.0 | $K_2O$ | 0.1 |
| 31 | 70.0 | 24.2 | 4.2 | MgO | 1.3 | $Na_2O$ | 0.3 |
| 32 | 70.0 | 25.6 | 3.2 | MgO | 0.8 | BaO | 0.4 |
| 33 | 70.0 | 27.1 | 2.1 | MgO | 0.3 | $Na_2O$ | 0.5 |
| 34 | 70.0 | 28.5 | 1.0 | MgO | 0.2 | CaO | 0.3 |
| 35 | 70.0 | 29.8 | | $Na_2O$ | 0.2 | | |
| 36 | 72.0 | 23.9 | 2.9 | MgO | 0.9 | $Na_2O$ | 0.3 |
| 37 | 72.0 | 25.2 | 1.9 | MgO | 0.6 | $Na_2O$ | 0.3 |
| 38 | 72.0 | 26.6 | 1.0 | MgO | 0.2 | CaO | 0.2 |
| 39 | 72.0 | 27.9 | | $Na_2O$ | 0.1 | | |
| 40 | 75.0 | 20.1 | 3.5 | MgO | 1.2 | BaO | 0.2 |
| 41 | 75.0 | 21.3 | 2.6 | MgO | 1.0 | $Na_2O$ | 0.1 |
| 42 | 75.0 | 22.6 | 1.7 | MgO | 0.4 | CaO | 0.3 |
| 43 | 75.0 | 23.8 | 0.9 | MgO | 0.2 | $Na_2O$ | 0.3 |
| 44 | 75.0 | 24.9 | | $Na_2O$ | 0.1 | | |
| 45 | 78.0 | 17.7 | 3.1 | MgO | 0.8 | CaO | 0.4 |
| 46 | 78.0 | 18.8 | 2.3 | MgO | 0.8 | $Na_2O$ | 0.1 |
| 47 | 78.0 | 19.9 | 1.5 | MgO | 0.4 | $Na_2$ | 0.2 |
| 48 | 78.0 | 20.9 | 0.8 | CaO | 0.3 | | |
| 49 | 78.0 | 21.3 | | BaO | 0.7 | | |
| 50 | 80.0 | 10.3 | 7.0 | CaO | 2.0 | $Na_2$ | 0.7 |
| 51 | 80.0 | 15.1 | 3.5 | BaO | 1.2 | $Na_2O$ | 0.2 |
| 52 | 80.0 | 16.1 | 2.8 | MgO | 1.0 | $Na_2O$ | 0.1 |
| 53 | 80.0 | 17.1 | 2.1 | MgO | 0.6 | CaO | 0.2 |
| 54 | 80.0 | 18.2 | 1.4 | MgO | 0.3 | $Na_2O$ | 0.1 |
| 55 | 80.0 | 19.0 | 0.7 | $K_2O$ | 0.3 | | |
| 56 | 80.0 | 19.7 | | $K_2O$ | 0.3 | | |

Figure 2:
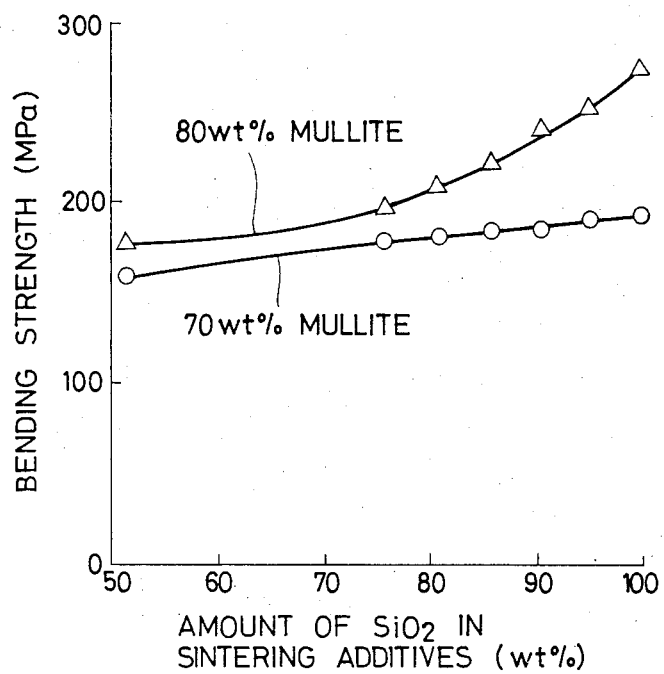
FIG. 2 is a graph showing the relationship between the $SiO_2$ content in the sintering additives and the bending strength of the ceramic insulating substrate layer of the present invention.

Table 2 shows the content (wt%) of the $Al_2O_3.SiO_2$ phases in each of the ceramic insulating substrate layers obtained and Table 3 shows the content (wt%) of glass component therein. The main component in each of the layers obtained is mullite. MgO is dissolved in mullite or $Al_2O_3.SiO_2$, and the amount of the solid solution does not exceed 1% calculated in terms of $M_gO$. If the value exceeds 1%, another crystalline phase is unfavorably formed and the thermal expansion coefficient thereof is different from that of the base crystals. FIG. 2 shows the relationship between the $SiO_2$ content in the sintering additives and the bending strength of the boards which contain 70 wt% mullite (No. 1 to 7) and those which contain 80 wt% mullite (No. 22 to 28). The four point bending method on the basis of JIS was adopted for the bending test. It is obvious from FIG. 2 that the bending strength has a tendency to rapidly increase with the increase in glass content. The bending strength is more than 180 MPs when the $SiO_2$ content in the sintering additive exceeds 80 wt%, for the mixture having 70 wt% mullite, and also when the $SiO_2$ content in the sintering additive exceeds 75 wt%, for the mixture having 80 wt% mullite.

Figure 3:
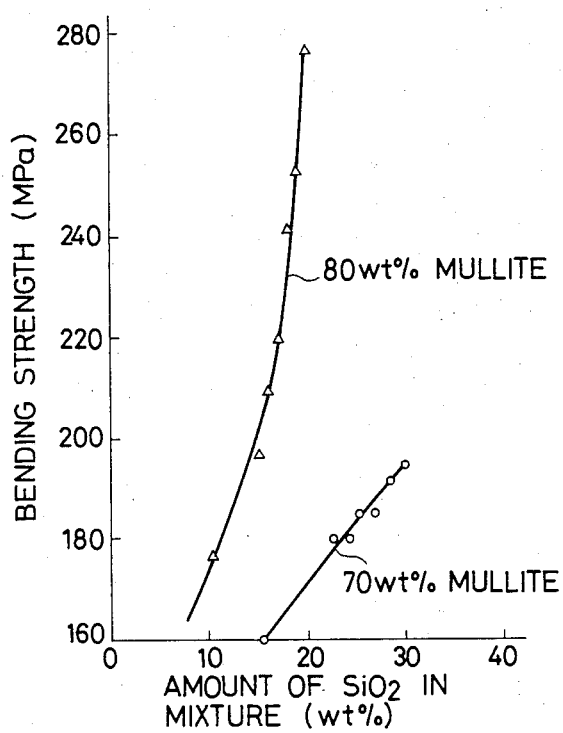
FIGS. 3 and 4 are graphs which show the relationship between the $SiO_2$ content and $Al_2O_3$ content in the mixture and the bending strength.

FIG. 3 shows the relationship between the amount of $SiO_2$ added and the bending strength. As shown in the graph, addition of $SiO_2$ improves the sintering degree of mullite and rapidly enhances the mechanical strength.

TABLE 2

| No. | $Al_2O_3.SiO_2$ | No. | $Al_2O_3.SiO_2$ |
|---|---|---|---|
| 1 | 23.0 | 22 | 18.0 |
| 2 | 15 | 23 | 12.0 |
| 3 | 12.5 | 24 | 10.5 |
| 4 | 10.3 | 25 | 8.8 |
| 5 | 7.5 | 26 | 6.3 |
| 6 | 4.7 | 27 | 4.3 |
| 7 | 2.0 | 28 | 1.3 |

TABLE 3

| No. | Glass Component | No. | Glass Component |
|---|---|---|---|
| 1 | 9 | 22 | 5 |
| 2 | 19 | 23 | 12 |
| 3 | 21 | 24 | 14 |
| 4 | 32 | 25 | 15 |
| 5 | 26 | 26 | 17 |
| 6 | 27 | 27 | 18 |
| 7 | 30 | 28 | 20 |

Figure 4:
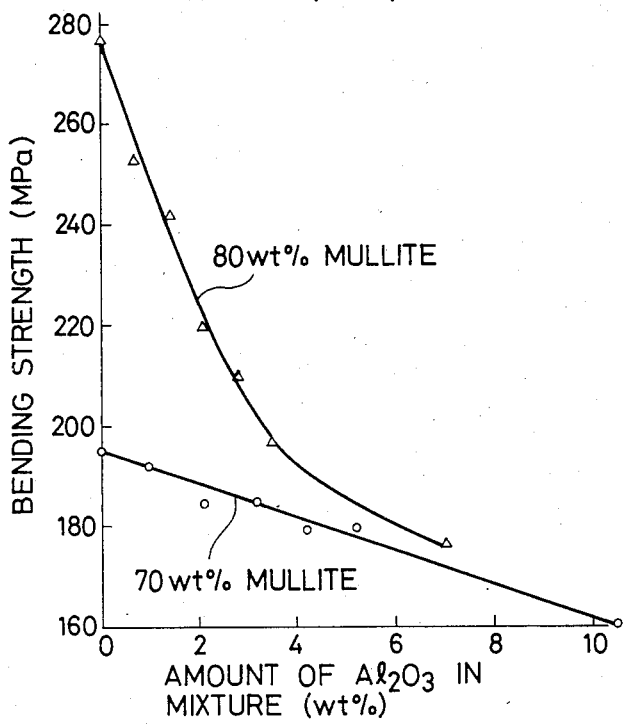

FIG. 4 shows the relationship between the amount of $Al_2O_3$ to be added and the bending strength. As is obvious from the graph, addition of $Al_2O_3$ rapidly lowers the strength. Therefore the amount of $Al_2O_3$ to be added is preferably 5% or less.

Figure 5:
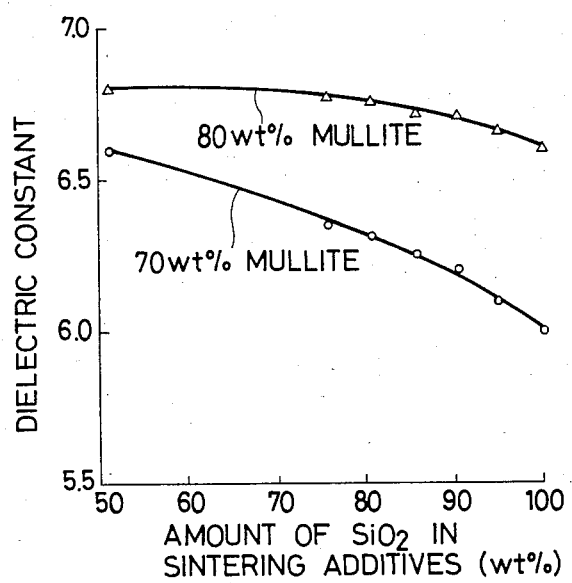
FIG. 5 is a graph showing the relationship between the $SiO_2$ content in the sintering additives and the dielectric constant of the ceramic insulating substrate layer of the present invention.

The relationship between the amount of $SiO_2$ in the sintering additive and the dielectric constant is shown in FIG. 5. In this graph, the mullite content is 70 wt% or 80 wt%. The dielectric constant was measured at a constant frequency of 1 MHz. The dielectric constant shows the tendency to decrease with the increase of the $SiO_2$ content in the sintering additives. When the mullite content is 80 wt%, the dielectric constant is less than 6.7, if the $SiO_2$ content in the sintering additive is more than 85 wt%. When the mullite content is 70 wt%, the dielectric constant is less than 6.7 even if the $SiO_2$ content in the sintering additive is about 50 wt%.

Figure 6:
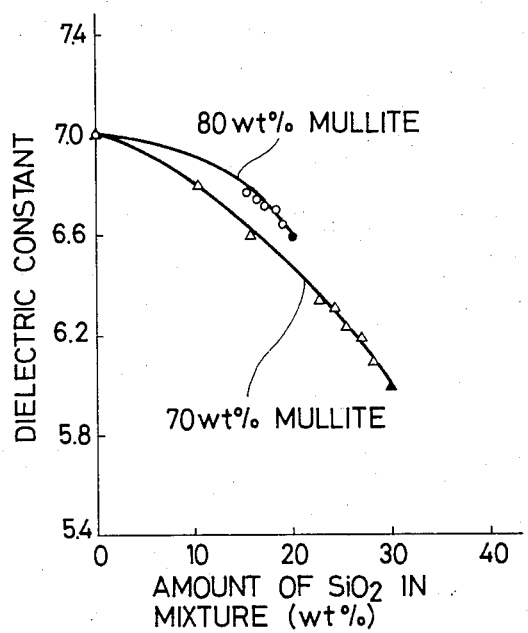
FIG. 6 is a graph which shows the relationship between the $SiO_2$ content in the mixture and the dielectric constant.

FIG. 6 shows the relationship between the dielectric constant and the amount of $SiO_2$ to be added. Addition of $SiO_2$ greatly lowers the dielectric constant. Especially, it is rapidly lowered when more than 15% $SiO_2$ is added, therefore addition of more than 15% $SiO_2$ is preferable.

Figure 7:
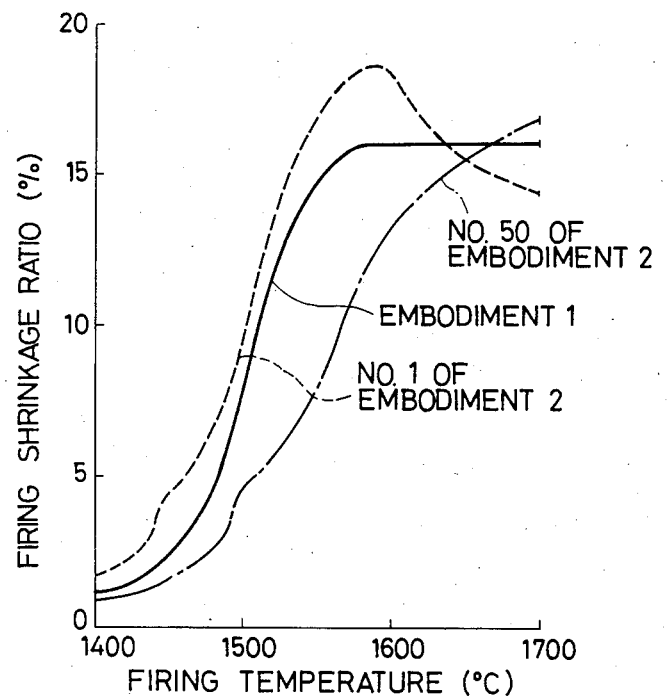
FIG. 7 is a graph which shows the relationship between the firing temperature and the firing shrinkage ratio of the ceramic insulating substrate layer of the present invention.

FIG. 7 shows the relationship between the firing temperature and the firing shrinkage ratio of each sample. It is clear from the graph that the sample of Embodiment 1 has a constant shrinkage ratio at a temperature above 1580° C., while in the sample No. 1 which contains 4.1% MgO and the sample No. 50 which contains CaO and $Na_2O$ of 2.7% in total amount, the firing shrinkage ratio varies at firing temperatures between 1,400 to 1,700° C. and does not become constant. This is disadvantageous in the case of firing a large quantity of material in an electric oven, in which the temperature differs from place to place, whereby materials having the same composition exhibit different firing shrinkage ratio and, hence, produce non-uniform products.

Figure 8:
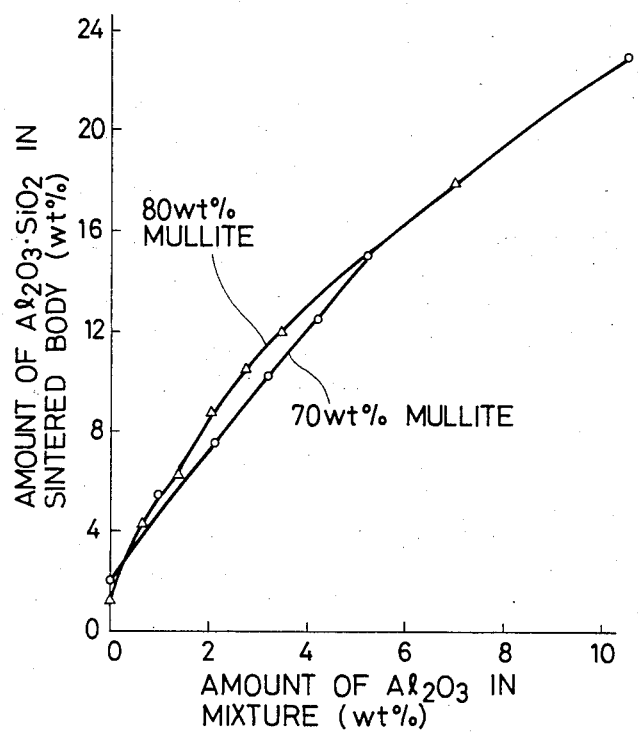
FIG. 8 is a graph showing the relationship between the $Al_2O_2.SiO_2$ content in the sintered body and $Al_2O_3$ content in the mixture.

The relationship between the amount of $Al_2O_3$ to be added and the amount of $Al_2O_3.SiO_2$ produced in the ceramic insulating substrate layers is shown in FIG. 8. As is clear from the graph, with the increase in additive amount of $Al_2O_3$, $Al_2O_3.SiO_2$ increases. These results show that the bending strength is high and the dielectric constant is small when the $SiO_2$ content in the sintering additives is more than 80 wt%, for a mullite content of 70 wt%, and also when the $SiO_2$ content in the sintering additives is more than 85 wt%, for a mullite content of 80 wt%.

X-ray diffraction was conducted in order to identify the crystalline phases in the sintered body of each of the ceramic insultating substrate layers having these compositions. When the content of alkaline earth metal oxide (MgO) is more than 1 wt%, $Al_2O_3.M_gO$ and $2Al_2O_3.2Mgo.5SiO_2$ are produced during heating up for firing. Also many crystalline phases including $Al_2O_3$, MgO and $SiO_2$ as well as those of $3Al_2O_3.2SiO_2$ and $Al_2O_3.SiO_2$ are formed in the vicinity of 1,600° C. at which sufficient firing is effected. As a result, the firing shrinkage ratio at each temperature is not constant and scatters largely.

On the other hand, when the alkaline earth metal oxide (MgO) is less than 1 wt%, $Al_2O_3.MgO$ and $2Al_2O_3.2MgO.5SiO_2$ are formed during heating up for firming together with large amount of $SiO_2$. However in the vicinity of 1,600° C. at which sufficient firing is effected, only $3Al_2O.2SiO_2$ and $Al_2O_3.SiO_2$ exist and stable crystalline phases are formed. As a result, in temperatures higher than 1,550° C., namely, at a temperature at which sufficient firing is effected, there is no change in crystalline phase and the firing shrinkage ratio is also stable. This tendency is the same with the samples Nos. 29 to 56 in Table 1. That is, when the total amount of alkali metal oxide and alkaline earth metal oxide is more than 1 wt%, the bending strength is less than 180 MPa, or the dielectric constant is more than 6.7. In addition, the crystalline phases after firing are not stable, and unstable crystalline phases are formed as well as the crystalline phases of $3Al_2O_3.2SiO_2$ and $Al_2O_3.SiO_2$.

On the other hand, if the total amount of alkaline metal oxide and alkaline earth metal oxide is less than 1 wt%, the bending strength is more than 180 MPa, and the dielectric constant is less than 6.7. In addition, the crystalline phases after firing are stable and in firing temperature above 1,550° C., only two kinds of crystalline phases of $3Al_2O_3.2SiO_2$ and $Al_2O_3.SiO_2$ exist. In other words, the alkali metal oxides and alkaline earth metal oxides are dispersed in the crystalline phases of $3Al_2O_3.2SiO_2$ and $Al_2O_3.SiO_2$ as a solid solution.

The thermal expansion coefficient of the ceramic insulating substrate layers having the composition shown in Table 1 is in the range of 40 to $60 \times 10^{-7}$/°C. (at room temperature to 500° C.), which approximately agrees with the thermal expansion coefficient $45 \times 10^{-7}$/°C. (at room temperature to 500°C.) of tungsten. Therefore, the thermal stress due to the difference in thermal expansion coefficient between the ceramic insulating substrate layers and the conductor layers and the via hole conductors is small, whereby no cracking is produced.

In the samples having the composition in which the total amount of the alkali metal oxide and alkaline earth metal oxide is less than 1 wt% (Table 1), the tensile strength of the Kovar pin was more than 4 kg/pin, high enough to be fit for practical use. No breaking of wire was produced at the solder juncture of the semiconductor component even after more than 2,000 heat cycle tests between $-65°$ C. and 150° C. The strength was so high as to ensure sufficient life time of the juncture under severe use conditions. This is because the thermal expansion coefficient of the sintered body is approximate both to the thermal expansion coefficient $35 \times 10^{-7}$/°C. (at room temperature to 500° C.) of a silicon simiconductor which is used as a semiconductor component, and to the thermal expansion coefficient $65 \times 10^{-7}$/°C. (at room temperature to 500° C.) of a gallium arsenide semiconductor. Further, a multilayered ceramic wiring circuit board on which a hybride of a silicon semiconductor and a gallium arsenide semiconductor is mounted, there is little difference in elongation between the board and the semiconductor component when they are heated, and therefore almost no thermal stress is applied to the solder juncture.

The signal propagation delay time through the internal wiring conductors was below 8.4 ns/m. This value corresponds to the dielectric constant of 6.7 of the ceramic insulating substrate layers. A ceramic insulating substrate layer of alumina has a dielectric constant of about 9.5 and the signal propagation delay time is 10.2 ns/m. This means that the signal propagation delay time was reduced more than 17% according to this embodiment.

We claim:

1. A multilayered ceramic wiring circuit board including a plurality of ceramic insulating substrate layers laminated integrally, conductor layers with predetermined patterns supported on the respective ceramic insulating substrate layers and via hole conductors provided at predetermined positions of the respective ceramic insulating substrate layers for interconnecting the respective conductor layers with predetermined patterns to form a predetermined wiring circuit, the conductor layers and the via hole conductors being made of either tungsten or molybdenum, characterized in that:
said ceramic insulating substrate layers consist essentially of,
    crystals of mullite and crystals of an oxide complex of aluminum oxide and silicon dioxide in molar ratio of 1:0.7–1;
    non-crystalline silicon dioxide occupying interstices between the crystals; and
    at least one compound selected from the group consisting of alkali metal oxide and alkaline earth metal oxide dissolved substantially in the crystals in solid solution.

2. The multilayered ceramic wiring circuit board according to claim 1 wherein said oxide complex is at least one of sillimanite, andalusite or kyanite.

3. The multilayered ceramice wiring circuit board according to claim 1 wherein the molar ratio of aluminum oxide and silicon dioxide in mullite is 3–4:2.

4. The mulilayered ceramic wiring circuit board according to claim 1, wherein the thermal expansion coefficient of said ceramic insulating substrate layer is $40$–$60 \times 10^{-7}$/°C.

5. The mulilayered ceramic wiring circuit board according to claim 1 wherein the dielectric constant of said ceramic insulating substrate layer is below 6.7.

6. A method of producing a multilayered ceramic wiring circuit board including a plurality of ceramic insulating substrate layers laminated integrally, conductor layers with predetermined patterns supported on the respective ceramic insulating substrate layers and via hole conductors provided at predetermined positions of the respective ceramic insulating substrate layers for interconnecting the respective conductor layers with predetermined patterns to form a predetermined wiring circuit, the conductor layers and the via hole conductors being made of either tungsten or molybdenum, characterized in that said ceramic insulating substrate layers are produced by:
    mixing more than 70 wt% of mullite powder having an average particle size of 5 μm, 10–30 wt% of silicon dioxide powder having an average particle size below 2 μm, less than 15 wt% of aluminum oxide powder having an average particle size below 1 μm and less than 1 wt% of metal oxide powder of at least one compound selected from the group consisting of alkali metal oxide and alkaline earth metal oxide;
    pressing and forming the mixture;
    forming via holes in the pressed and formed mixture;
    filling said via holes with a conductive paste;
    forming conductor layers on the pressed and formed mixture;
    firing the pressed and formed mixture at a temperature above where the firing shrinkage ratio thereof becomes constant simultaneously with said conductor layers and said via hole conductors,
    whereby said ceramic insulating substrate layers thus produced consist essentially of crystals of mullite, sillimanite, andalusite and kyanite; non-crystalline silicon dioxide occupying the interstices between the crystals and at least one compound selected from the group consisting of alkali metal oxide and alkaline earth metal oxide dissolved substantially in the crystals in solid solution and have a thermal expansion coefficient of $40$–$60 \times 10^{-7}$/°C. and a dielectric constant below 6.7.

7. The method of producing a multilayered ceramic wiring circuit board according to claim 6 wherein the mixture consists essentially of 70–80 wt% of mullite, 15–30 wt% of silicon dioxide, 1–5 wt% of aluminum oxide and less than 1 wt% of magnesium oxide.

8. The method of producing a multilayered ceramic wiring circuit board according to claim 7 wherein the mixture consists essentially of 72 wt% of mullite, 25–27 wt% of silicon dioxide, 1.0–2.0 wt% of aluminum oxide and 0.4–0.8 wt% of magnesium oxide.

9. The method of producing a multilayered ceramic wiring circuit board according to claim 6 wherein the molar ratio of aluminum oxide and silicon dioxide of mullite in the mixture is 3–4:2.

10. The method of producing a multilayered ceramic wiring circuit board according to claim 6 wherein the firing temperature is 1,550°–1,680° C.

11. The method of producing a multilayered ceramic wiring circuit board according to claim 10 wherein the firing temperature is 1,580°–1,620° C.

12. A method of producing a multilayered ceramic wiring circuit board comprising:
    forming a mixture of more than 70 wt% of mullite powder, 10–30 wt% of silicon dioxide powder, less than 15 wt% of aluminum oxide powder and less than 1 wt% of metal oxide powder;

adding a resin to said mixture;

adding a plastisizing agent to said mixture;

blending the mixture, resin and plastisizing agent to form a slurry;

forming the blended mixture into a plurality of green sheets;

forming via holes in said green sheets;

filling the via holes with a conductive paste;

printing a predetermined circuit onto said green sheets;

stacking a plurality of said green sheets, such that via holes on individual green sheets are aligned with via holes on other green sheets; and firing the stacked assembly at a temperature above the temperature at which the firing shrinkage ratio becomes constant.

13. The method of producing a multilayered ceramic wiring circuit board according to claim 12, wherein the molar ratio of aluminum oxide to silicon dioxide of said mullite powder is 3–4:2, and said mullite has an average particle size below 5 micrometers;

said silicon dioxide powder is quartz powder with an average particle size below 2 micrometers;

said aluminum oxide powder is alumina powder with an average particle size below 1 micrometer; and said metal oxide powder is selected from the group consisting of alkaline metal oxide and alkaline earth metal oxide.

14. A method of producing a multilayered ceramic wiring circuit board according to claim 13, wherein said metal oxide powder is magnesium oxide.

15. A method of producing a multilayered ceramic wiring circuit board according to claim 12, wherein said mixture consists essentially of 70–80 wt% of mullite powder, 15–30 wt% of silicon dioxide powder, 1–5 wt% of aluminum oxide powder and less than 1 wt% of magnesium oxide.

16. A method of producing a multilayered ceramic wiring circuit board according to claim 15, wherein said mixture consists essentially of 72 wt% of mullite powder, 25–27 wt% of silicon dioxide powder, 1–2 wt% of aluminum oxide powder and 0.4–0.8 wt% of magnesium oxide.

17. A method of producing a multilayered ceramic wiring circuit board according to claim 12, wherein said green sheets have a thickness of 0.23 mm.

18. A method of producing a multilayered ceramic wiring circuit board according to claim 12, wherein said temperature in the step of firing is 1550°–1680° C.

19. A method of producing a multilayered ceramic wiring circuit board according to claim 18, wherein said temperature in the firing step is 1580°–1620° C.

20. A method of producing a multilayered ceramic wiring circuit board according to claim 12, further including before the step of firing, heating the stacked assembly in a firing oven to a temperature at which the resin is removed from the green sheets.

21. A method of producing a multilayered ceramic wiring circuit board according to claim 20, wherein said temperature in the heating step is 1200° C.

* * * * *